US006569768B2

(12) United States Patent
Ruelke et al.

(10) Patent No.: US 6,569,768 B2
(45) Date of Patent: May 27, 2003

(54) SURFACE TREATMENT AND CAPPING LAYER PROCESS FOR PRODUCING A COPPER INTERFACE IN A SEMICONDUCTOR DEVICE

(75) Inventors: Hartmut Ruelke, Dresden (DE); Joerg Hohage, Dresden (DE); Minh Van Ngo, Fremont, CA (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/804,657

(22) Filed: Mar. 12, 2001

(65) Prior Publication Data

US 2002/0072218 A1 Jun. 13, 2002

(30) Foreign Application Priority Data

Nov. 29, 2000 (DE) ......................................... 100 59 143

(51) Int. Cl.[7] ............................................... H01L 21/44
(52) U.S. Cl. ...................... 438/687; 438/694; 438/791; 438/792
(58) Field of Search ................................ 438/687, 694, 438/707, 712, 720, 906, 791, 792

(56) References Cited

U.S. PATENT DOCUMENTS

| 5,200,031 A | * | 4/1993 | Latchford et al. ............ 216/13 |
| 5,447,887 A | | 9/1995 | Filipiak et al. ............. 437/200 |
| 5,540,812 A | * | 7/1996 | Kadomura ................. 438/710 |
| 5,700,740 A | * | 12/1997 | Chen et al. .................. 438/710 |
| 6,010,603 A | * | 1/2000 | Ye et al. ................. 204/192.35 |
| 6,136,680 A | | 10/2000 | Lai et al. ..................... 438/597 |
| 6,140,255 A | | 10/2000 | Ngo et al. .................... 438/791 |
| 6,146,988 A | | 11/2000 | Ngo et al. .................... 438/618 |
| 6,153,523 A | | 11/2000 | Van Ngo et al. ............. 438/687 |
| 6,174,810 B1 | * | 1/2001 | Islam et al. ................. 438/687 |
| 6,214,717 B1 | * | 4/2001 | Lan et al. .................... 438/612 |
| 6,355,571 B1 | * | 3/2002 | Huang et al. ................ 438/706 |
| 6,376,353 B1 | * | 4/2002 | Zhou et al. .................. 438/612 |

FOREIGN PATENT DOCUMENTS

| DE | 19953864 A1 | 8/2000 | |
| WO | 00/29642 A1 | 5/2000 | |
| WO | 02/09173 A2 | 1/2002 | ......... H01L/21/768 |

* cited by examiner

*Primary Examiner*—Amir Zarabian
*Assistant Examiner*—Maria Guerrero
(74) *Attorney, Agent, or Firm*—Williams, Morgan & Amerson

(57) ABSTRACT

A method for removing discoloration and corrosion of an exposed copper surface and for forming a nitride capping layer on top of the surface provides an in-situ process in which the reactive plasma ambient is constantly maintained during a transition from the surface treatment step to the deposition step for forming the nitride capping layer. Permanently maintained plasma avoids an renewed formation of discoloration on the cleaned copper surface during the transition to the deposition step and at the beginning of the deposition step when silane gas is introduced into the plasma ambient. Moreover, the overall process time is significantly reduced.

17 Claims, No Drawings

SURFACE TREATMENT AND CAPPING LAYER PROCESS FOR PRODUCING A COPPER INTERFACE IN A SEMICONDUCTOR DEVICE

BACKGROUND OF THE INVENTION

1. Field of the Invention

The present invention relates to the manufacturing of integrated circuits, and particularly to an improved process for forming a capping layer on a copper metallization layer in a semiconductor device.

2. Description of the Related Art

The manufacturing process of modern integrated circuits involves the fabrication of numerous semiconductor devices, such as insulated gate field effect transistors, on a single substrate. To provide increased integration density of the integrated circuits, on the one hand, and, on the other hand, improved device performance, for instance with respect to signal processing time and power consumption, feature sizes of the semiconductor devices are steadily decreasing. The enormous number of semiconductor devices formed on a single chip area, however, reduces the available space for, and hence the cross section of, metallization lines connecting the individual semiconductor devices. As a consequence, the increased electrical resistance of the metallization lines, due to their reduction in size, begins to offset the advantages regarding signal performance of a transistor device that are obtained by reducing the dimensions of a field effect transistor, when a certain amount of reduction of the feature sizes is reached. The electrical resistance of the metallization lines can be reduced in that aluminum, preferably used in modern integrated circuits, is replaced by a conductive material having a lower specific resistance. One candidate for such a low-ohmic material for metallization lines in ultra high-density integrated circuits is copper. Although processing of copper in a semiconductor production line is extremely difficult since the slightest contamination of process equipment not involved in the copper process have an adverse effect on the performance of the final devices, copper is the preferred metallization metal in high end integrated circuits exhibiting feature sizes of 0.2 $\mu$m and beyond. Employing a copper metallization layer in the semiconductor devices, however, gives rise to additional problems, such as corrosion and discoloration, which result in insufficient adhesion to adjacent materials, the consequence being degraded long-time stability of the transistor device. For this reason, after polishing and planarizing the copper metallization layer by means of chemical mechanical polishing (CMP), a reactive plasma treatment is commonly performed to try to remove any copper oxide formed on the copper surface that is exposed by the CMP step. Subsequently, a capping layer, usually a silicon nitride layer, is deposited over the plasma-treated copper metallization layer so as to improve adhesion of the copper to the capping layer to thereby enhance the long-time stability of the metallization layer.

A typical prior art process flow for generating a capping layer over a copper metallization layer may comprise the following process steps. As is well known, after filling openings formed in a dielectric layer with a barrier metal and copper, the excess barrier metal and the excess copper will be removed by a CMP step. The resulting surface of the semiconductor structure obtained by the CMP step comprises surface portions of copper as well as surface portions of the dielectric material, wherein the ratio of exposed copper to dielectric material depends on the type of metallization layer and design rules of the device. As previously mentioned, a subsequent reactive plasma etch step will typically be performed to remove corrosion and discoloration, primarily consisting of copper oxide, formed on the exposed copper surface after the CMP step. To this end, a wafer with the exposed and planarized metallization layer is inserted into a reaction chamber providing a dynamic reactive plasma ambient. The reactive plasma ambient is dynamic in the sense that feed gas is continuously introduced into the chamber and gases are continuously pumped away. Since the plasma etch equipment is well known in the art, a detailed description of a corresponding apparatus will be omitted. For removing copper oxide from the surface of the metallization layer, typically ammonia ($NH_3$) gas is continuously fed to the reaction chamber at a predefined flow rate for a predefined time interval while a predefined pressure is maintained in the reaction chamber. Typical process parameters for an according process may be as follows. In a set-up step, approximately 800 sccm ammonia ($NH_3$) at a chamber pressure of approximately eight Torr are supplied for approximately fifteen seconds. Subsequently, the high frequency electric field for initiating the plasma is initiated at approximately 200 W for approximately 40 seconds while maintaining the ammonia ($NH_3$) flow rate and the pressure in the reaction chamber. Finally, a pump step is carried out for at least 30 seconds to remove reactive gas by-products created during the ammonia ($NH_3$) treatment. The duration of the pump step depends on the amount of copper exposed in the metallization layer.

Moreover, typically an in-situ deposition step is carried out to form the capping layer immediately after the ammonia ($NH_3$) treatment. For the deposition of the capping layer, in this case silicon nitride, silane gas ($SiH_4$) is additionally introduced into the reaction chamber. To control the exposure of the ammonia ($NH_3$)-plasma-treated copper surface to silane gas, usually a so-called ramp-up step is carried out in which the flow rate of the silane gas is slowly increased. A typical process flow for the deposition of the silicon nitride layer may comprise the following steps. First, a set-up step of approximately five seconds is carried out with an ammonia ($NH_3$) flow rate of approximately 260 sccm and a nitrogen flow rate of approximately 8600 sccm. Thereafter, a ramp-up step of approximately five seconds with a silane flow rate of approximately 50 sccm is performed while maintaining the flow rates for ammonia ($NH_3$) and nitrogen. In the following five seconds, the silane flow rate is increased to approximately 100 sccm. In a final ramp-up step of approximately five seconds, the silane flow rate is increased to approixximately 150 sccm and is maintained for a further twelve seconds to deposit the silicon nitride capping layer. Finally, a purge step of approximately ten seconds with nitrogen with a flow rate of approximately 8600 sccm and a subsequent pumping step of about fifteen seconds complete the cycle. According to the process described above, a total time of approximately 142 seconds is required for the ammonia ($NH_3$) treatment of the copper surface and the subsequent deposition of the capping layer. With such a process, the silicon nitride capping layer may have a thickness ranging from approximately 300–800 Å.

However, discoloration and corrosion on the copper surface can still be observed when the reaction by-products cannot be effectively removed after the plasma treatment, or when silane is contacting the copper surface in the case when a ramp-up process, in providing the silane gas, is not sufficient to avoid surface reaction of the copper with the reactive ambient. This may occur when design dependent applications of the process described above impose restrictions for the ramp-up step. Moreover, in order to more effectively remove reactive by-products after the plasma treatment, an even longer pump step is required which, on the other hand, significantly reduces throughput.

In view of the above problems, a need exists for an improved process for forming a capping layer on a surface including exposed copper portions.

SUMMARY OF THE INVENTION

According to the present invention, a method of producing a capping layer for a copper surface portion in a semiconductor device is provided, wherein the method comprises providing a substrate having formed thereon a material layer including an exposed surface with a dielectric area and a copper area, creating a dynamic reactive plasma ambient comprising an ammonia ($NH_3$) flow, exposing the surface to the reactive plasma ambient to remove corrosion and discoloration from the copper area. The method further comprises introducing a gaseous compound comprising silicon into the reactive plasma ambient while maintaining the plasma ambient so as to deposit a silicon nitride capping layer on the exposed surface, thereby avoiding discoloration and corrosion at an interface between the copper area and the silicon nitride layer.

The present invention is based on the inventor's finding that applying a long pump step in combination with a slow ramp up introduction of silane gas into the reaction chamber may be relatively efficient in reducing copper corrosion, but does not completely avoid the corrosion, and, furthermore, does not exhibit constant results in removing corrosion and discoloration. According to the inventors' teaching, copper corrosion is believed to be a product of the reaction of the silane burst and the byproducts from the ammonia ($NH_3$) plasma treatment on the clean copper surface. If the copper oxide is removed from the surface, the copper is very sensitive to a renewed formation of corrosion on the surface in view of reactive gases and any temperature variations. Furthermore, the inventors found that any discoloration, particularly a redness of the copper, on the copper surface is located within the copper oxide, and hence, this discoloration is a surface effect that can be removed by reprocessing the copper surface with an ammonia ($NH_3$) plasma treatment to remove the copper oxide. Consequently, the present invention provides a method in which the reactive plasma is continuously maintained while the silane gas is introduced into the reaction chamber for initiating the subsequent deposition of a silicon nitride layer on top of the cleaned copper surface. The continuously maintained plasma may be considered as a "continuous reprocessing" of the copper surface so as to permanently remove any repeatedly formed discoloration. As a result, a substantially complete elimination of the copper corrosion effect can be observed.

According to a further variation, the reactive plasma ambient is initiated by a high-frequency electric field which is maintained during the transition from the ammonia ($NH_3$) treatment to the silicon nitride deposition.

In a further embodiment of the present invention, the power of the high-frequency electric field is increased during the deposition step so that a rapid and efficient deposition is achieved while the maintained plasma effectively prevents corrosion.

According to a further embodiment of the present invention, the total time required for carrying out the method is less than 100 seconds, so that additionally due to the significantly improved removal of discoloration and corrosion, a drastic increase in throughput is obtained.

DETAILED DESCRIPTION OF THE INVENTION

Further advantages and objects of the present invention will become more apparent with the following detailed description and the appended claims. Furthermore, it is to be noted that although the present invention is described with reference to the embodiments as illustrated in the following detailed description, it should be noted that the following detailed description is not intended to limit the present invention to the particular embodiments disclosed, but rather the described embodiment merely exemplifies the various aspects of the present invention, the scope of which is defined by the appended claims.

The present invention will now be described with reference to the formation of a copper metallization layer connecting a plurality of transistor devices in an integrated circuit. It should be noted, however, that the present invention is also applicable to any process in which an exposed copper surface portion is to be covered by a capping layer, and wherein it is desirable to eliminate or reduce any corrosion and discoloration effects of the copper surface so as to insure an improved adhesion of the copper to the capping layer.

As previously described, the semiconductor wafer is inserted into a reaction chamber of a reactive plasma etching apparatus as is well known in the art after the surface of the semiconductor has been polished and planarized by a chemical mechanical polishing (CMP) step. The present invention may be employed in a variety of reaction chambers. One illustrative reaction chamber that may be used with the present invention is a Producer-Twin-Chamber manufactured by Applied Materials Inc.

In an initial set-up step, $NH_3$ gas is supplied to the reaction chamber for about eighteen seconds with a flow rate of about 800 sccm (standard cubic centimeter per minute), wherein the pressure in the reaction chamber is adjusted to about eight Torr. Next, the actual treatment of the copper surface is started in that the high frequency electric field for initiating the plasma is turned on with a high-frequency power of about 200 W. During this treatment step of about 40 seconds, the initial ammonia ($NH_3$) flow rate and the chamber pressure are maintained. Thereafter, a so-called transition step is performed for about seven seconds in which the ammonia ($NH_3$) flow rate is reduced to about 260 sccm, and nitrogen gas is introduced into the chamber with a flow rate of about 8600 sccm, wherein the pressure in the chamber is reduced to about 4.8 Torr. Importantly, the high-frequency electric field is maintained during the transition step so as to avoid any discoloration on the exposed copper surface.

Next, a deposition step is carried out for about twelve seconds in which the ammonia ($NH_3$) flow rate and the nitrogen flow rate are maintained at the value of the corresponding flow rates in the transition step, and additionally silane gas, with a flow rate of about 150 sccm, is introduced into the reaction chamber. The high-frequency power is increased to about 500 W and the pressure is kept constant at 4.8 about Torr. During the deposition step, with the increased high-frequency power, a silicon nitride layer is efficiently deposited on the cleaned copper surface without corroding the copper surface. Due to the maintained high frequency field during the transition step, the initial silane burst at the beginning of the deposition step does not cause corrosion and discoloration of the copper surface. Subsequently, the high-frequency power is turned off and the ammonia ($NH_3$) and silane gas flows are stopped so that the reaction chamber is purged for about five seconds with nitrogen at a flow rate of about 8600 sccm. Finally, a pump step is performed for about ten seconds. Using this process, a silicon nitride capping layer having a thickness ranging from approximately 300–800 Å is formed. According to this embodiment, the total time for the copper surface treatment and capping layer deposition is about 92 seconds, which is considerably lower than the prior art method described in the introductory part of the description.

A person skilled in the art will readily appreciate that process parameters in a reactive plasma treatment are highly interrelated so that, for example, the flow rate of the feed gases, the pressure in the reaction chamber, and the time of duration of individual process steps may be varied within certain limits, thereby still achieving the advantages provided by the present invention. For example, increasing the pressure in the reaction chamber during the treatment of the exposed copper surface may reduce the time interval required for obtaining a desired degree of removal of the surface defects of the copper surface. Similarly, the flow rate of ammonia ($NH_3$) may be increased to obtain a shorter treatment time. Regardless of the selected process parameters it is, however, important to maintain a plasma during the treatment, the transition, and the deposition so as to eliminate or reduce corrosion and discoloration of the copper surface. The process parameters pointed out above represent the currently preferred embodiment. The advantages of the present invention are also obtained by parameter values falling within the following ranges:

Nitrogen ($N_2$) flow rate: 5000 sccm to 10000 sccm;

Ammonia ($NH_3$) flow rate: 200 sccm to 1000 sccm;

Silane ($SiH_4$) flow rate: 100 sccm to 300 sccm;

transition time: 3 seconds to 12 seconds;

deposition time: 8 seconds to 20 seconds;

high frequency power during transition step: 50 W to 300 W.

The value of 200 W for the high frequency power during the transition step may be reduced to 100 W or even 50 W as long as a plasma ambient is maintained. Preferably, the high-frequency power is increased in the deposition step so as to allow the introduction of a relatively high flow rate of silane gas, for example 150 sccm or more as described above, to obtain a rapid silicon nitride formation without the adverse effect of the direct contact of silane gas with the cleaned copper surface at the beginning of the deposition step. It is, however, possible to maintain the high frequency power at a value that is used during the transition step and provide instead a ramp-up step to weaken an initial silane gas burst. This will cause an increased deposition time which may be desirable under certain circumstances.

As a result, the present invention provides an in-situ ammonia ($NH_3$) plasma treatment and a nitride capping layer deposition on exposed copper surface portions that substantially eliminates any corrosion or discoloration on the copper surface portions for the benefit of an increased adhesion of the capping layer to the copper portions, which significantly contributes to an increased reliability of semiconductor devices including copper lines, such as metallization layers, in modern integrated circuits.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of producing a capping layer for a copper surface interface in a semiconductor device, comprising:

providing a substrate having formed thereon a material layer including an exposed surface with a dielectric area and a copper area;

creating a dynamic reactive plasma ambient comprising an ammonia ($NH_3$) gas flow using a high-frequency electric field applied to the ammonia ($NH_3$);

exposing the surface to the reactive plasma ambient to remove corrosion and discoloration from the copper area;

reducing a first flow rate of ammonia ($NH_3$) in the reaction chamber for a transition time interval while maintaining the high frequency field; and introducing a gaseous compound comprising silicon into the reactive plasma ambient while maintaining said plasma ambient so as to deposit a silicon nitride capping layer on the surface.

2. The method of claim 1, further comprising purging and pumping the reactive plasma ambient while introduction of ammonia ($NH_3$) and of the gaseous compound is stopped.

3. The method of claim 1, wherein a total processing time is less than 100 second.

4. The method of claim 1, wherein said silicon nitride capping layer has a thickness ranging from approximately 300–800 Å.

5. The method of claim 1, wherein creating the reactive plasma ambient further comprises:

introducing ammonia ($NH_3$) into a reaction chamber at the first flow rate for a first time interval while maintaining a first pressure in the reaction chamber; and applying the high frequency electric field to initiate the reactive plasma ambient.

6. The method of claim 1, wherein the transition time interval is less than about 10 seconds.

7. The method of claim 1, further comprising introducing nitrogen ($N_2$) during the transition time interval.

8. The method of claim 1, wherein introduction of the gaseous compound is stopped after a deposition time interval has elapsed.

9. The method of claim 1, wherein said gaseous compound is silane.

10. The method of claim 5, wherein the high frequency field applied prior to introducing the gaseous compound is sufficient to maintain the reactive plasma ambient.

11. The method of claim 6, wherein the transition time interval is about 7 s.

12. The method of claim 7, wherein nitrogen ($N_2$) is introduced with a second flow rate in a range between about 10 000 sccm and 5000 sccm, and adjusting a process pressure of the reactive plasma ambient to substantially match a value used for the deposition of the silicon nitride capping layer.

13. The method of claim 8, wherein the deposition time interval is in the range between about 8 seconds and 16 seconds.

14. The method of claim 8, wherein the high frequency electric field during the transition time interval is less than the high frequency electric field during the deposition time interval.

15. The method of claim 14, wherein the high frequency electric field during the transition time interval is in the range of about 20 W to about 300 W.

16. The method of claim 9, wherein said ammonia is introduced at a third flow rate ranging from approximately 200–1000 sccm and silane is introduced at a fourth flow rate ranging from 100–300 sccm.

17. The method of claim 16, wherein the third flow rate within the transition time interval is adjusted to substantially match the fourth flow rate during the introduction of silane.

* * * * *